United States Patent
Zitlaw et al.

(10) Patent No.: US 7,036,004 B2
(45) Date of Patent: Apr. 25, 2006

(54) POWER UP INITIALIZATION FOR MEMORY

(75) Inventors: Clifford Zitlaw, San Jose, CA (US); Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 819 days.

(21) Appl. No.: 09/915,134

(22) Filed: Jul. 25, 2001

(65) Prior Publication Data

US 2003/0023840 A1    Jan. 30, 2003

(51) Int. Cl.
G06F 12/00    (2006.01)

(52) U.S. Cl. ............................. 713/1; 711/103; 365/228

(58) Field of Classification Search ................ 365/201, 365/203, 226, 228; 327/142, 143; 710/10, 710/14, 35; 711/103, 167, 154, 166, 170; 712/37; 713/1, 2; 714/718, 721
See application file for complete search history.

(56) References Cited

U.S. PATENT DOCUMENTS

| | | | |
|---|---|---|---|
| 5,416,363 A | 5/1995 | Duesman | |
| 5,581,206 A | 12/1996 | Chevallier et al. | |
| 5,615,159 A | 3/1997 | Roohparvar | |
| 5,677,885 A | 10/1997 | Roohparvar | |
| 5,717,639 A | 2/1998 | Williams et al. | |
| 5,723,990 A | 3/1998 | Roohparvar | |
| 5,767,711 A | 6/1998 | Chevallier et al. | |
| 5,887,162 A | 3/1999 | Williams et al. | |
| 5,896,551 A | 4/1999 | Williams et al. | |
| 5,905,909 A | 5/1999 | Williams et al. | |
| 6,046,615 A | 4/2000 | Chevallier et al. | |
| 6,167,495 A | 12/2000 | Keeth et al. | |
| 6,178,501 B1 | 1/2001 | Ingalls | |
| 6,229,352 B1 | 5/2001 | Chevallier et al. | |
| 6,246,626 B1 | 6/2001 | Roohparvar | |
| 6,366,158 B1 * | 4/2002 | Zeng et al. | 327/536 |
| 6,785,765 B1 * | 8/2004 | Roohparvar | 711/103 |
| 6,820,196 B1 * | 11/2004 | Kessler | 713/1 |

OTHER PUBLICATIONS

Q-Flash Memory, www.micron.com, Oct. 4, 10/4/200, pp. 1-20.*
SGS-Thomson ST10F166 16-Bit MCU with 256 K Flash Memory, Feb. 1996, pp. 1, 5.*

* cited by examiner

Primary Examiner—Christian P. Chace
(74) Attorney, Agent, or Firm—Leffert Jay & Polglaze, P.A.

(57) ABSTRACT

An improved Flash memory device with a synchronous interface has been detailed that enhances initialization of the Flash memory device. In the prior art, initialization of synchronous Flash memory requires the release of hardware signal line, RP#, or an initialization command, LCR, and a following initialization time wait period of 50 μS to 100 μS. The improved Flash memory device of the detailed invention begins initialization of internal values upon acquiring stable power. The initialization cycle of the detailed synchronous Flash memory loops and continues until a "STOP" command is received from the host controller and is immediately available for access. This allows the utilization of the detailed synchronous Flash memory in systems wherein the host controller cannot supply an initializing signal (RP# or LCR). The detailed synchronous Flash memory also allows for immediate availability of the Flash memory upon issuance of the "STOP" command allowing for a fast first access.

38 Claims, 3 Drawing Sheets

POWER UP INITIALIZATION FOR MEMORY

TECHNICAL FIELD OF THE INVENTION

The present invention relates generally to integrated circuits and in particular the present invention relates to power up initialization of memory devices.

BACKGROUND OF THE INVENTION

Memory devices are typically provided as internal storage areas in the computer. The term memory identifies data storage that comes in the form of integrated circuit chips. There are several different types of memory used in modem electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modem PCs have their BIOS stored on a Flash memory chip so that it can easily be updated if necessary. Such a BIOS is sometimes called a Flash BIOS.

A typical Flash memory comprises a memory array, which includes a large number of memory cells. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Both RAM and ROM random access memory devices have memory cells that are typically arranged in an array of rows and columns. During operation, a row (page) is accessed and then memory cells can be randomly accessed on the page by providing column addresses. This access mode is referred to as page mode access. To read or write to multiple column locations on a page requires the external application of multiple column addresses. To speed access time, a burst mode access has been implemented. The burst mode uses an internal column address counter circuit to generate additional column addresses. The address counter begins at an externally provided address and advances in response to an external clock signal or a column address strobe signal.

A synchronous DRAM (SDRAM) is a type of DRAM that can run at much higher clock speeds than conventional DRAM memory. SDRAM synchronizes itself with a CPU's bus and is capable of running at 100 MHZ or 133 MHZ, about three times faster than conventional FPM (Fast Page Mode) RAM, and about twice as fast EDO (Extended Data Output) DRAM and BEDO (Burst Extended Data Output) DRAM. An extended form of SDRAM that can transfer a data value on the rising and falling edge of the clock signal is called double data rate SDRAM (DDR SDRAM, or simply, DDR). SDRAM's can be accessed quickly, but are volatile. Many computer systems are designed to operate using SDRAM, but would benefit from non-volatile memory. A synchronous Flash memory has been designed that allows for a non-volatile memory device with an SDRAM interface. Although knowledge of the function and internal structure of a synchronous Flash memory is not essential to understanding the present invention, a detailed discussion is included in U.S. patent application Ser. No. 09/627,682 filed Jul. 28, 2000 and titled, "Synchronous Flash Memory," which is commonly assigned and incorporated by reference.

In general, the goal of synchronous Flash is to mimic the architecture of SDRAM. It has an SDRAM interface which is compatible to SDRAM for read operation to the synchronous Flash memory. Programming, erasing, block protection and other Flash specific function differ from SDRAM and are performed with a three cycle SDRAM command sequence.

Synchronous Flash memory devices, and Flash memories in general, attempt to speed up operation by copying key internal data and lookup tables into small internal RAM structures for internal state machines and the Flash memory itself to operate against. Therefore after power up, Flash memories must load these tables and generally initialize themselves before they are available for external access. This initialization preferably occurs after power has reached operating levels and is stable, otherwise corruption of the internal data registers and state machines is possible. Because of this the synchronous Flash memory initialization cycle is typically triggered by an external system signal. The external system must then wait a predefined time period for the initialization cycle to complete before accessing the synchronous Flash memory device.

FIG. 1 shows a synchronous memory system of the prior art, including a processor 100 (also known as a host controller), a memory bus 102, a synchronous RAM memory (SDRAM or DDR-SDRAM) 104, and a synchronous Flash memory device 106 of the prior art. Initialization is triggered in synchronous Flash memories, such as shown in FIG. 1, by the release of the active low reset/power up signal (RP#) (not shown) or by use of a load command register (LCR) initialization command to the Flash memory device. The initialization cycle completes 50 μS to 100 μS after being triggered. The signal RP# in the synchronous memory system of FIG. 1 is generally controlled by the host controller. Unfortunately, many current host controllers do not support the use of the RP# signal or LCR command and therefore cannot utilize the synchronous Flash memory 106 of FIG. 1.

For the reasons stated above, and for other reasons stated below which will become apparent to those skilled in the art upon reading and understanding the present specification, there is a need in the art for a synchronous non-volatile Flash memory device that can initialize without use of the RP# signal or the LCR command and provide a fast time to first access.

SUMMARY OF THE INVENTION

The above-mentioned problems with memory device initialization and other problems are addressed by the present invention and will be understood by reading and studying the following specification.

In one embodiment, a synchronous Flash memory device comprises a memory array, a control circuit, and a synchronous memory interface, wherein the synchronous Flash memory device begins an iterating initialization cycle upon receiving a power signal on a power bus, and stops the iterating initialization cycle upon receiving an external command.

In another embodiment, a memory device comprises a memory array, a control circuit, and a memory interface, wherein the memory device commences a continuously looping initialization cycle upon receiving a power signal, and stops the continuously looping initialization cycle upon receiving an external signal.

In yet another embodiment, a synchronous Flash memory device comprises a memory array, a control circuit, and a synchronous SDRAM compatible memory interface, wherein the synchronous Flash memory device begins a continuously looping initialization cycle upon a power signal on a power bus reaching a specified trip point, and stops the iterating initialization cycle upon receiving an external "STOP" command on the synchronous SDRAM compatible memory interface.

In a further embodiment, a Flash memory device comprises a memory array, a control circuit, and a memory interface, wherein the Flash memory device begins a continuously looping initialization cycle upon a power signal on a power bus reaching a specified trip point, and stops the iterating initialization cycle upon receiving an external "STOP" command.

A method of initializing a synchronous Flash memory device comprises commencing a continuously looping initialization cycle upon receiving a power signal, and stopping the continuously looping initialization cycle upon receiving an external command.

In another method of initializing a memory device comprises starting a repeating initialization cycle upon receiving a power signal on a power distribution line, and stopping the repeating initialization cycle upon receiving an external command.

In another embodiment, a system comprises a host controller, and a synchronous Flash memory device coupled to the host controller, wherein the synchronous Flash memory device comprises, a memory array, a control circuit, and a synchronous memory interface. The synchronous Flash memory device begins an iterating initialization cycle upon receiving a power signal on a power bus, and stops the iterating initialization cycle upon receiving an external command.

In yet another embodiment, a computer system comprises a processor, and a memory device coupled to the processor, wherein the memory device begins to iterate an initialization cycle in response to Vcc, and stops iterating the initialization cycle in response to the processor.

In another method of operating a computer system comprises coupling a processor to a memory device, detecting Vcc in the memory device, starting an iterating initialization cycle in the memory device, and stopping iteration of the initialization cycle in the memory device in response to a software command from the processor.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
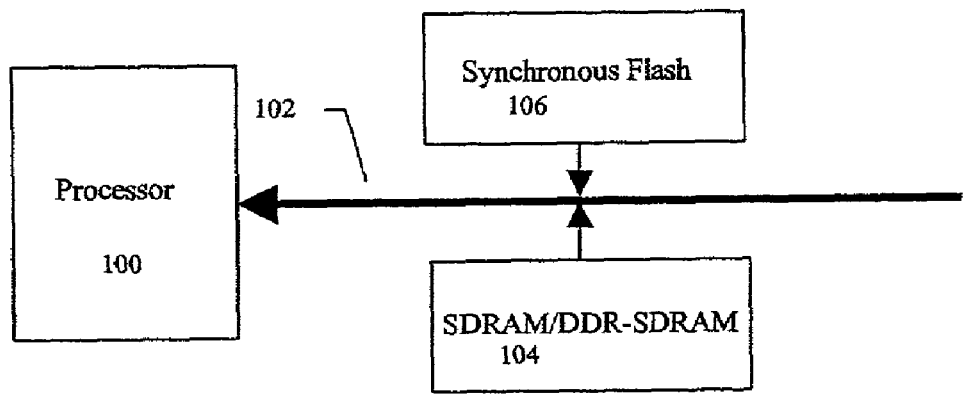
FIG. 1 details a prior art memory system with synchronous Flash memory.
Figure 2:
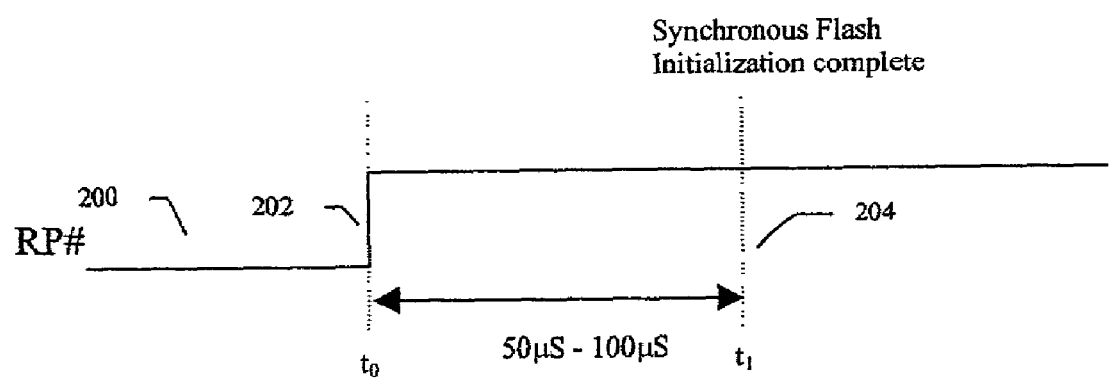
FIG. 2 illustrates a prior art signal waveform of reset/power up (RP#) during initialization of a synchronous Flash memory device.

Shown in FIG. 2 is an illustration of a waveform of the prior art showing the active low signal, reset/power down (RP#) 200, being released 202 by a compatible synchronous host controller (not shown) after power up. Release of RP# 202 is used as a signal to start initialization of a synchronous Flash memory device of the prior art. After release of RP# 202 (RP# going high) at time to, the synchronous Flash memory device begins its internal initialization cycle and 50 µS to 100 µS later at time $t_1$ 204 the synchronous Flash memory is available and ready for access by the host controller.

This synchronous Flash memory device initialization cycle, as stated above, can also be triggered by the issuance of a load command register (LCR) command on the synchronous interface by a compatible host controller.

To overcome this reliance on RP#, or an LCR command, a Flash memory of the present invention starts initialization as soon as power, in the form of a valid Vcc level, is applied. The internal Flash initialization cycle then loops and continues initializing until a "STOP" command is issued by the host controller to the Flash memory.

Figure 3:
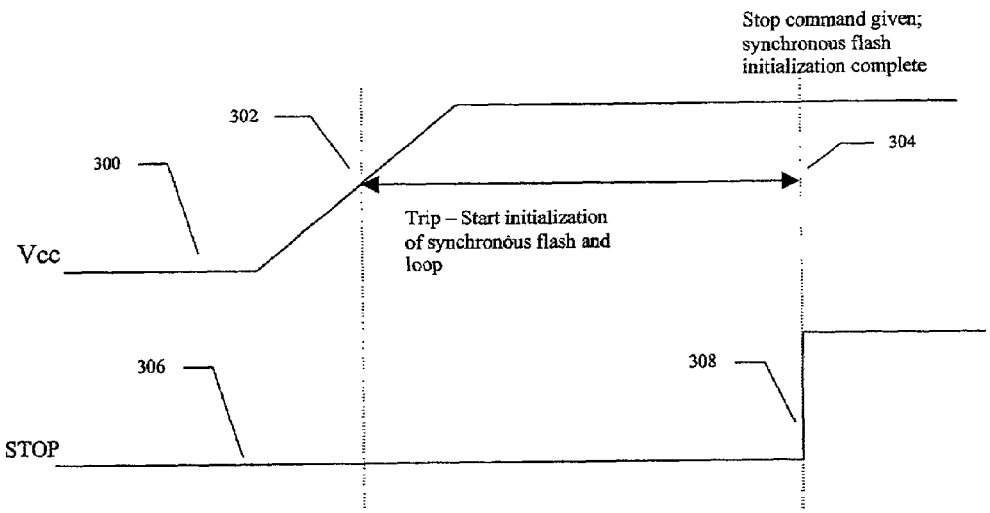
FIG. 3 illustrates a signal waveform of Vcc showing power up and initialization of a Flash memory of the present invention.

Shown in FIG. 3 is an illustration of a waveform showing Vcc 300 in relation to an initialization response to Vcc upon power up of a Flash memory device of the present invention. In FIG. 3, upon Vcc reaching a specified "trip" point 302, the Flash memory of an embodiment of the present invention starts its internal initialization cycle. The initialization cycle of the Flash memory continuously loops until a "STOP" command 304 is received from the host controller. For illustrative purposes a signal representing the "STOP" command 306 is shown in FIG. 3, although it is noted that this command can take many forms. Examples of this command include, but are not limited to, a hardware signal, multiple hardware signals, a specific sequence of hardware signals, a software command or sequence of software commands, or some combination thereof. The signal representing the "STOP" command 306 transitions from low to high when the "STOP" command 308, 304 is sent to the Flash memory of an embodiment of the present invention.

Figure 4:
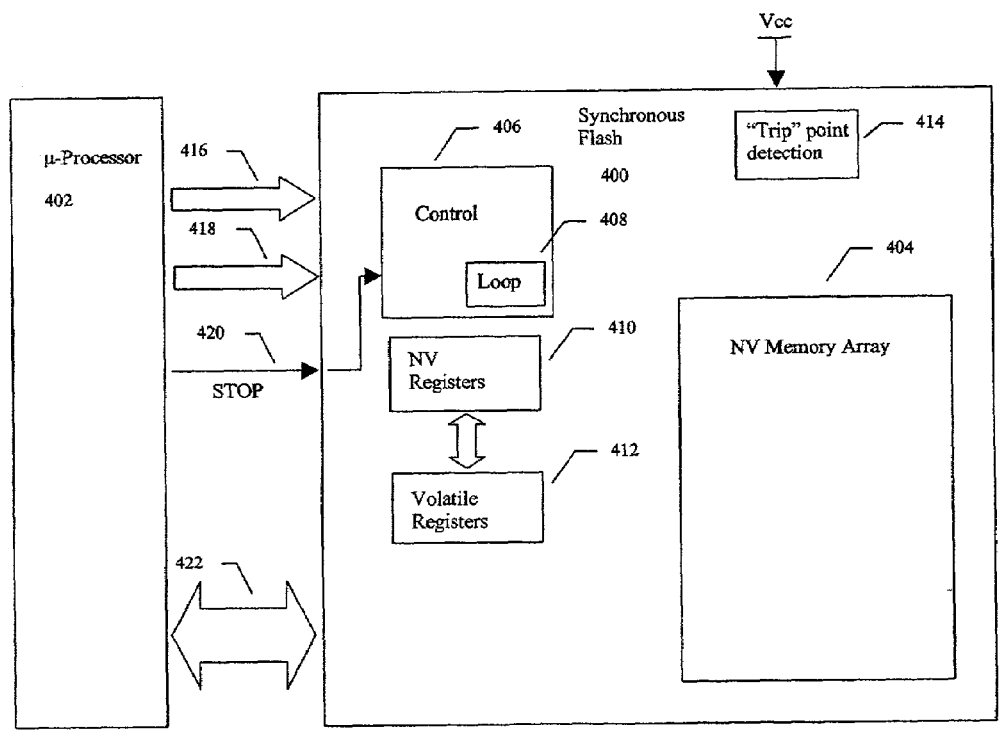
FIG. 4 details a synchronous memory system containing a Flash memory of the present invention, and a processor.

Shown in FIG. 4 is a diagram of a system that includes a processor 402 coupled to a simplified diagram of a Flash memory embodiment of the present invention 400. The Flash memory 400 of FIG. 4 internally includes a non-volatile memory array 404, a control circuit 406 that includes an initialization loop control circuit 408, non-volatile registers 410, volatile registers 412, and an initialization trip point detection circuit 414. The Flash memory 400 is coupled to the processor 402 with an address interface 416, a control interface 418, a data interface 422, and, for illustrative purposes, a signal line representing the "STOP" command 420, although as noted above this command can take many forms.

In the system of FIG. 4, upon Vcc reaching a specified "trip" point, the initialization trip point detection circuit 414 triggers the Flash memory 400 to start its internal initialization cycle under control of the control circuit's 406 loop control circuit 408. The initialization cycle of the Flash memory 400 continuously loops, loading values from the non-volatile registers 410 to the volatile registers 412 for operation, and performing other initialization tasks, until a "STOP" command is received from the host controller. The signal line representing the "STOP" command 420 is shown in FIG. 4 internally coupled to the control circuit 406, where it halts the initialization cycle.

It is noted that with the relative instability of Vcc upon power up, and even at the trip point 302 of FIG. 3, that the first few initialization cycles may not be entirely successful. Corrupt initialization values may be loaded by the Flash memory of the present invention if the initialization cycle happens when power is not stable. However, it is only the final iterations of the initialization cycle that need to load successfully for the Flash memory to have a valid initialization. It is also noted that the initialization procedure of a Flash memory of the present invention can be stopped at any point in the initialization process. Because of the looping continuous initialization cycle, the Flash memory of the present invention will still have a valid initialization data load of internal Flash variables forward of the stopping point of the initialization cycle so long as the previous initialization iteration loop completed successfully.

In addition, with a continuous looping initialization cycle that begins at the first availability of a valid Vcc, also allows a Flash memory of the present invention to be available for access by a host controller sooner. A Flash memory of the prior art has the initialization cycle wait period after the corresponding initialization signal (RP# or LCR).

With initialization starting with the availability of Vcc, a Flash memory device of the present invention does not require the hardware signal RP# for operation and to begin initialization. Therefore, a Flash memory device of the present invention can operate with host controllers that do not have a way for providing a hardware initialization signal to the Flash memory, such as RP#.

However, a Flash memory device of the present invention does require a software "STOP" signal to stop the initialization cycle. The software signal must be issued to a Flash memory of the present invention by the host controller device. This requires in some cases the appropriate software routines to be loaded into the system and/or host controller. Loading these software routines can be problematic if there is no other source of storage for the routines than the Flash memory of the present invention. For example, if the Flash memory of the present invention contains the BIOS code of the system it is currently installed in. Therefore a secondary source of non-volatile storage that does not require such initialization must exist in systems where in the host controller requires loading of software routines to issue the "STOP" command and allow access of the Flash memory of the present invention.

Figure 5:
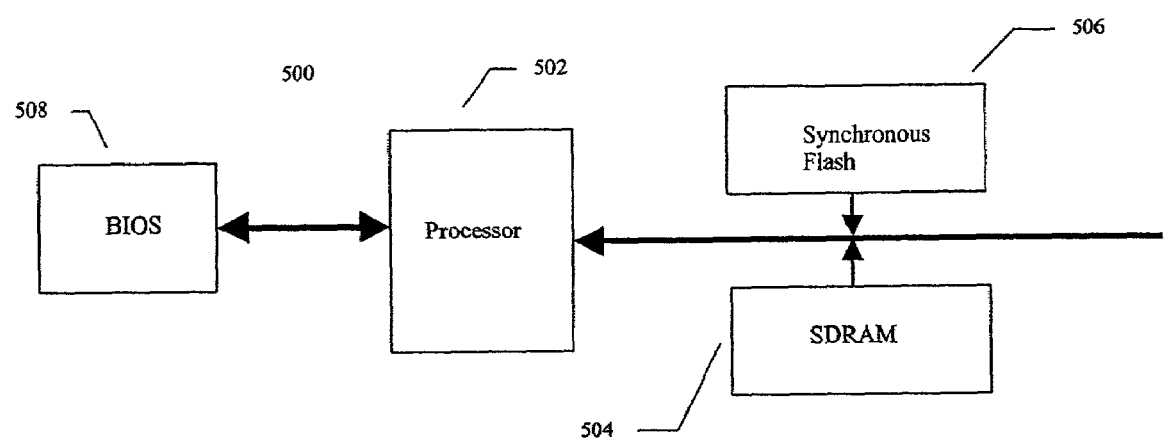
FIG. 5 details a synchronous memory system containing a BIOS memory device, a synchronous Flash memory of the present invention, and a synchronous RAM.

One such a system is shown in FIG. 5, wherein a processor/host controller 502 is coupled to an SDRAM memory device 504 and a synchronous Flash memory device 506. A non-volatile memory device 508 containing BIOS code is also coupled to the processor/host controller 502. In the system of FIG. 5, the non-volatile memory device 508 containing the BIOS code of the system 500, also contains the software routines necessary for the system to access the synchronous Flash memory device 506 and issue the "STOP" command to end its looping initialization cycle.

The system of FIG. 5 is more commonly found in computer systems of older age with a separate slower bus for the BIOS memory. As host controllers that require loading of software routines to issue the "STOP" command also tend to be in older systems, the older systems such as the system 500 of FIG. 5 could be easily modified to accommodate the synchronous Flash memory devices of the present invention by simply modifying the BIOS code. Such ability allows for easy retrofit of existing systems to include synchronous Flash memory of the present invention.

CONCLUSION

An improved Flash memory device with a synchronous interface has been detailed that enhances initialization of the Flash memory device. In the prior art, initialization of synchronous Flash memory requires the release of hardware signal line, RP#, or an initialization command, LCR, and a following initialization time wait period of 50 μS to 100 μS. The improved Flash memory device of the detailed invention begins initialization of internal values upon acquiring stable power. The initialization cycle of the detailed synchronous Flash memory loops and continues until a "STOP" command is received from the host controller and is immediately available for access. This allows the utilization of the detailed synchronous Flash memory in systems wherein the host controller cannot supply an initializing signal (RP# or LCR). The detailed synchronous Flash memory also allows for immediate availability of the Flash memory upon issuance of the "STOP" command allowing for a fast first access.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A synchronous Flash memory device comprising:
   a memory array;
   a control circuit; and
   a synchronous memory interface, wherein the synchronous Flash memory device begins an iterating process upon receiving a power signal on a power bus, and stops the iterating process upon receiving an external electronic command, and where the iterating process iterates at least twice and performs an initialization cycle of the synchronous Flash memory device during each iteration.

2. The synchronous Flash memory device of claim 1, wherein the external electronic command is received through the synchronous interface.

3. The synchronous Flash memory device of claim 2, wherein the external electronic command is an SDRAM compatible "STOP" command.

4. The synchronous Flash memory device of claim 1, wherein the synchronous interface is an SDRAM or a DDR-SDRAM compatible interface.

5. The synchronous Flash memory device of claim 1, wherein the iterating process of repeating initialization cycles begins when the power signal on the power bus reaches a predefined trip point.

6. The synchronous Flash memory device of claim 1, wherein the iterating process of repeating initialization cycles begins a predefined time period after receiving the power signal on the power bus.

7. The synchronous Flash memory device of claim 1, wherein the iterating process of repeating initialization cycles stops at a random point in the currently executing initialization cycle when the external electronic command is received.

8. A memory device comprising:
a memory array;
a control circuit; and
a memory interface, wherein the memory device commences a continuously looping cycle upon receiving a power signal, and stops the continuously looping cycle upon receiving an external system signal, and where the continuously looping cycle loops at least twice and performs an initialization of the memory device during each loop.

9. The memory device of claim 8, wherein the memory device is a non-volatile memory device.

10. The memory device of claim 8, wherein the memory device is a synchronous Flash memory device.

11. The memory device of claim 8, wherein the memory interface is a synchronous memory interface.

12. The memory device of claim 8, wherein the continuously looping cycle commences when the power signal reaches an identified level.

13. The memory device of claim 8, wherein the continuously looping cycle commences a predefined time period after receiving the power signal.

14. The memory device of claim 8, wherein the continuously looping cycle completes at a random point in the initialization when the external system signal is received.

15. A synchronous Flash memory device comprising:
a memory array;
a control circuit; and
a synchronous SDRAM compatible memory interface, wherein the synchronous Flash memory device begins a continuously looping cycle upon a power signal, on a power bus reaching a specified trip point, and stops the iterating cycle upon receiving an external "STOP" command on the synchronous SDRAM compatible memory interface, and where the iterating cycle iterates two or more times and performs a power up initialization of the synchronous Flash memory device during each iteration.

16. A Flash memory device comprising:
a memory array;
a control circuit; and
a memory interface, wherein the Flash memory device begins a continuously looping cycle upon a power signal on a power bus reaching a specified trip point, and stops the continuously looping cycle upon receiving an external "STOP" command, and where the continuously looping cycle loops at least twice and performs a power up initialization of the Flash memory device during each loop.

17. A method of initializing a synchronous Flash memory device comprising:
commencing a continuously looping cycle upon receiving a power signal, where the continuously looping cycle loops at least twice and performs a power up initialization of the synchronous Flash memory device during each loop; and
stopping the continuously looping cycle upon receiving an external system command.

18. The method of claim 17, wherein commencing the continuously looping cycle of power up initializations upon receiving the power signal further comprises commencing the continuously looping cycle upon the received power signal reaching a predetermined value.

19. The method of claim 17, wherein commencing the continuously looping cycle of power up initializations upon receiving the power signal further comprises commencing the continuously looping cycle upon the received power signal reaching a predetermined value and waiting for a delay period.

20. The method of claim 17, wherein stopping the continuously looping cycle of power up initializations upon receiving the external system command further comprises stopping the continuously looping cycle at an in-progress point in the initialization cycle upon receiving the external system command.

21. The method of claim 17, wherein receiving the external system command further comprises receiving the external system command through a synchronous interface as one of a hardware signal or a memory software command.

22. A method of initializing a memory device comprising:
starting a repeating initialization cycle upon receiving a power signal on a power distribution line, wherein the repeating initialization cycle repeats at least twice and performs a power up initialization of the memory device during each repetition; and
stopping the repeating initialization cycle upon receiving an external system command.

23. The method of claim 22, wherein starting the repeating initialization cycle upon receiving the power signal on the power distribution line further comprises starting the repeating initialization cycle upon the power signal on the power distribution line reaching a predetermined voltage level.

24. The method of claim 22, wherein starting the repeating initialization cycle upon receiving the power signal on the power distribution line further comprises starting the repeating initialization cycle upon the power signal on the power distribution line reaching a predetermined voltage level and waiting a set delay time period.

25. The method of claim 22, wherein stopping the repeating initialization cycle upon receiving the external command further comprises stopping the repeating initialization cycle at a random point in the initialization cycle upon receiving the external system command.

26. The method of claim 22, wherein the memory device is a non-volatile memory device.

27. The method of claim 26, wherein the non-volatile memory device is a synchronous Flash memory device.

28. A system comprising:
a host controller; and
a synchronous Flash memory device coupled to the host controller, wherein the synchronous Flash memory device comprises,
a memory array,
a control circuit, and
a synchronous memory interface, wherein the synchronous Flash memory device begins an iterating process upon receiving a power signal on a power bus, and stops the iterating process upon receiving an external system command, where the iterating process iterates at least twice and performs a power up initialization cycle of the memory device during each iteration.

29. The computer system of claim 28, further comprising a separate external data source.

30. The computer system of claim 29, wherein the separate external data source further comprises a non-volatile memory device.

31. The computer system of claim 29, wherein the separate external data source is coupled to the host controller on a separate bus.

32. The computer system of claim 31, wherein the separate bus is a non-synchronous bus.

33. The computer system of claim 28, wherein the host controller receives software routines to control the synchronous Flash memory device from a non-volatile data source.

34. The computer system of claim 33, wherein the non-volatile data source is a non-volatile memory device containing BIOS.

35. The computer system of claim 28, wherein the host controller stops the iterating process of the synchronous Flash memory by issuing the external system command.

36. The computer system of claim 28, wherein the host controller comprises a processor or an integrated chipset.

37. A computer system comprising:
a host controller; and
a memory device coupled to the host controller, wherein the memory device begins to iterate a repeating initialization cycle in response to Vcc, and stops iterating the initialization cycle in response to the host controller, wherein the initialization cycle repeats at least twice and performs a power up initialization of the memory device during each iteration.

38. A method of operating a computer system comprising:
coupling a host controller to a memory device;
detecting Vcc in the memory device;
starting an iterating process in the memory device, wherein the iterating process iterates at least twice and performs a power up initialization cycle of the memory device during each iteration; and
stopping iteration of the iterating initialization cycle process in the memory device in response to a software command from the host controller.

* * * * *